United States Patent
Robert Safavi et al.

(10) Patent No.: US 11,271,594 B2
(45) Date of Patent: Mar. 8, 2022

(54) TRANSMITTING DEVICE, RECEIVING DEVICE AND METHODS THEREOF USING AN INTERLEAVED CODEWORD

(71) Applicant: Huawei Technologies Co., Ltd., Shenzhen (CN)

(72) Inventors: Anahid Robert Safavi, Kista (SE); Alberto Giuseppe Perotti, Segrate (IT); Branislav M. Popovic, Kista (SE)

(73) Assignee: Huawei Technologies Co., Ltd., Shenzhen (CN)

( * ) Notice: Subject to any disclaimer, the term of this patent is extended or adjusted under 35 U.S.C. 154(b) by 0 days.

(21) Appl. No.: 16/595,090

(22) Filed: Oct. 7, 2019

(65) Prior Publication Data

US 2020/0099400 A1     Mar. 26, 2020

Related U.S. Application Data (63) Continuation of application No. PCT/EP2017/072643, filed on Sep. 8, 2017.

(51) Int. Cl.
*H03M 13/00* (2006.01)
*H03M 13/27* (2006.01)
(Continued)

(52) U.S. Cl.
CPC ... *H03M 13/2792* (2013.01); *H03M 13/1102* (2013.01); *H03M 13/2707* (2013.01);
(Continued)

(58) Field of Classification Search
CPC ......... H03M 13/2792; H03M 13/1102; H03M 13/2707; H03M 13/635; H04L 1/0063; H04L 1/0071
See application file for complete search history.

(56) References Cited

U.S. PATENT DOCUMENTS

| 8,171,374 | B2 * | 5/2012 | Miyazaki | ........... H03M 13/1168 |
| | | | | 714/758 |
| 8,498,357 | B2 * | 7/2013 | Jung | ..................... H04L 1/0071 |
| | | | | 375/267 |

(Continued)

FOREIGN PATENT DOCUMENTS

| CN | 1335722 A | 2/2002 |
| CN | 1433178 A | 7/2003 |

(Continued)

OTHER PUBLICATIONS

"Bit interleaver for LDPC codes," 3GPP TSG RAN WG1 Meeting NR#3, Nagoya, Japan, R1-1715501, Total 11 pages, 3rd Generation Partnership Project, Valbonne, France (Sep. 18-21, 2017).

(Continued)

*Primary Examiner* — Esaw T Abraham
(74) *Attorney, Agent, or Firm* — Leydig, Voit & Mayer, Ltd.

(57) ABSTRACT

A transmitting device is described for a communication system. The transmitting device obtains an information message comprising information bits addressed for a receiving device and encodes the information message to obtain a codeword. The transmitting device rate-matches the codeword to produce a rate-matched codeword comprising systematic bits and parity-check bits. Furthermore, the transmitting device jointly interleaves the systematic bits and parity-check bits of the rate-matched codeword to obtain an interleaved codeword. The systematic bits of the interleaved codeword are mapped to modulation label positions of a modulation constellation with first reliabilities, and the parity-check bits of the interleaved codeword are mapped to modulation label positions of the modulation constellation with second reliabilities.

23 Claims, 6 Drawing Sheets

(51) Int. Cl.
*H03M 13/11* (2006.01)
*H04L 27/36* (2006.01)
*H04L 1/00* (2006.01)

(52) U.S. Cl.
CPC ........ *H03M 13/635* (2013.01); *H04L 1/0063* (2013.01); *H04L 1/0071* (2013.01); *H04L 27/36* (2013.01); *H04L 27/364* (2013.01)

(56) References Cited

U.S. PATENT DOCUMENTS

| | | | |
|---|---|---|---|
| 9,300,517 B2* | 3/2016 | Park | H04L 1/0003 |
| 9,769,591 B2* | 9/2017 | Nguyen | H04W 4/70 |
| 9,819,445 B1* | 11/2017 | Patel | H04L 1/0052 |
| 9,893,842 B2* | 2/2018 | Eder | H04L 1/1845 |
| 10,305,633 B2* | 5/2019 | Manolakos | H03M 13/2757 |
| 10,355,820 B2 | 7/2019 | Park et al. | |
| 10,595,311 B2* | 3/2020 | Gupta | H04W 72/02 |
| 10,680,764 B2* | 6/2020 | Young | H04L 1/1819 |
| 10,728,080 B2 | 7/2020 | Sankar et al. | |
| 2002/0199147 A1 | 12/2002 | Kim et al. | |
| 2003/0081690 A1 | 5/2003 | Kim et al. | |
| 2003/0159100 A1* | 8/2003 | Buckley | H04L 1/1816 714/758 |
| 2007/0002969 A1 | 1/2007 | Jeong et al. | |
| 2009/0100300 A1 | 4/2009 | Kim et al. | |
| 2009/0249166 A1* | 10/2009 | Miki | H04L 1/0071 714/762 |
| 2011/0142163 A1 | 6/2011 | Kwon et al. | |
| 2013/0117622 A1 | 5/2013 | Blankenship et al. | |
| 2015/0131427 A1 | 5/2015 | Han et al. | |
| 2015/0263825 A1 | 9/2015 | Kim et al. | |
| 2016/0380763 A1 | 12/2016 | Ahn et al. | |
| 2017/0012740 A1 | 1/2017 | Shen et al. | |
| 2017/0086220 A1 | 3/2017 | Kim et al. | |
| 2017/0264394 A1 | 9/2017 | Shen et al. | |
| 2018/0026663 A1 | 1/2018 | Wu et al. | |
| 2019/0103883 A1 | 4/2019 | Ye et al. | |
| 2019/0312679 A1 | 10/2019 | Jayasinghe et al. | |
| 2020/0007160 A1 | 1/2020 | Li et al. | |

FOREIGN PATENT DOCUMENTS

| | | |
|---|---|---|
| CN | 101090305 A | 12/2007 |
| CN | 101119178 A | 2/2008 |
| CN | 101119182 A | 2/2008 |
| CN | 101325474 A | 12/2008 |
| CN | 101330351 A | 12/2008 |
| CN | 101442383 A | 5/2009 |
| CN | 101636938 A | 1/2010 |
| CN | 101911566 A | 12/2010 |
| CN | 102122966 A | 7/2011 |
| CN | 102835086 A | 12/2012 |
| CN | 102934383 A | 2/2013 |
| CN | 103023618 A | 4/2013 |
| CN | 103401571 A | 11/2013 |
| CN | 104067609 A | 9/2014 |
| CN | 105099622 A | 11/2015 |
| EP | 1748592 A2 | 1/2007 |
| EP | 2034649 A1 | 3/2009 |
| EP | 3113387 A1 | 1/2017 |
| EP | 3128782 A1 | 2/2017 |
| WO | 2015123842 A1 | 8/2015 |
| WO | 2016082142 A1 | 6/2016 |

OTHER PUBLICATIONS

"Text proposal for SMP (Symbol Mapping based on bit Priority)," TSG-RAN WG1 #23, Espoo, Finland, Tdoc R1-02-0024, Total 6 pages, 3rd Generation Partnership Project, Valbonne, France (Jan. 8-11, 2002).
"Polar Codes Contruction and Rate Matching Scheme," 3GPP TSG RAN WG1 Meeting #89, Hangzhou, China, R1-1707183, pp. 1-14, 3rd Generation Partnership Project, Valbonne, France (May 15-19, 2017).
"LDPC parity check bits interleaver," 3GPP TSG RAN WG1 NR Ad Hoc Meeting, Nagoya, Japan, R1-xxxxx, Total 4 pages, 3rd Generation Partnership Project, Valbonne, France (Sep. 18-21, 2017).
"Enhanced HARQ Method with Signal Constellation Rearrangement," TSG-RAN Working Group 1 Meeting #19, Las Vegas, USA, TSGR1#19(01)0237, pp. 1-11, 3rd Generation Partnership Project, Valbonne, France (Feb. 27-Mar. 2, 2001).
"3rd Generation Partnership Project; Technical Specification Group Radio Access Network; Evolved Universal Terrestrial Radio Access (E-UTRA); Physical channels and modulation (Release 14)," 3GPP TS 36.211 V14.3.0, pp. 1-195, 3rd Generation Partnership Project, Valbonne, France (Jun. 2017).
Jia et al., "Enhanced HARQ Employing LDPC Coded Constellation Rearrangement with 64QAM," 2006 International Conference on Communication Technology, Total 4 pages, Institute of Electrical and Electronics Engineers, New York, New York (Nov. 2006).
"LDPC Rate Matching," 3GPP TSG-RAN WG1 #89ah, Qingdao, China, R1-1711212, pp. 1-6, 3rd Generation Partnership Project, Valbonne, France (Jun. 27-30, 2017).
"Rate Matching Schemes for Polar Codes," 3GPP TSG-RAN WG1 #89, Hangzhou, China, R1-1707075, Total 6 pages, 3rd Generation Partnership Project, Valbonne, France (May 15-19, 2017).
"3rd Generation Partnership Project; Technical Specification Group Radio Access Network; NR; Multiplexing and channel coding (Release 15)," 3GPP TS 38.212 V1.0.0, pp. 1-28, 3rd Generation Partnership Project, Valbonne, France (Sep. 2017).
"WF on LDPC parity check matrices," 3GPP TSG RAN WG1 NR AH #2, Qingdao, China, Agenda item 5.1.4.1.2, R1-1711982, Total 2 pages, 3rd Generation Partnership Project, Valbonne, France (Jun. 27-30, 2017).
"3rd Generation Partnership Project; Technical Specification Group Radio Access Network; Evolved Universal Terrestrial Radio Access (E-UTRA); Multiplexing and channel coding (Release 14)," 3GPP TS 36.212 V14.3.0, pp. 1-198, 3rd Generation Partnership Project, Valbonne, France (Jun. 2017).
"On design of bit-level interleaver," 3GPP TSG-RAN WG1 Meeting #AH NR, Prague, Czech, R1-1713710, Total 6 pages, 3rd Generation Partnership Project, Valbonne, France (Aug. 21-25, 2017).
Brink "Convergence of iterative decoding," IEEE Electronics Letters, vol. 35, No. 10, pp. 806-808, Institute of Electrical and Electronics Engineers, New York, New York (May 1999).
"Design of multiple family LDPC codes," 3GPP TSG-RAN WG1 #88, Athens, Greece, R1-1702642, Total 10 pages, 3rd Generation Partnership Project, Valbonne, France (Feb. 13-17, 2017).
"Bit-level interleaver of LDPC codes on high order modulation," 3GPP TSG RAN WG1 #90, Prague, Czechia, R1-1714589, Total 16 pages, 3rd Generation Partnership Project, Valbonne, France (Aug. 21-25, 2017).
Stierstorfer et al., "Optimizing BICM with convolutional codes for transmission over the AWGN channel," International Zurich Seminar on Communications (IZS), pp. 106-109, Zurich, Switzerland (Mar. 3-5, 2010).
"Bit Priority Mapping for LTE Shared TrCH Processing Chain," 3GPP TSG-RAN Working Group 1 #49, Kobe, Japan, Tdoc R1-072270, Total 2 pages, 3rd Generation Partnership Project, Valbonne, France (May 7-11, 2007).
"Performance evaluation of LDPC codes for NR eMBB data," 3GPP TSG RAN WG1 Meeting #90, Prague, Czech Republic, R1-1713740, Total 4 pages, 3rd Generation Partnership Project, Valbonne, France (Aug. 21-25, 2017).
"LDPC design for eMBB data," 3GPP TSG RAN WG1 NR Ad-Hoc Meeting, Spokane, USA, R1-1700092, Total 17 pages, 3rd Generation Partnership Project, Valbonne, France (Jan. 16-20, 2017).
"3rd Generation Partnership Project; Technical Specification Group Radio Access Network; NR; Physical channels and modulation (Release 15)," 3GPP TS 38.211 V1.0.0, pp. 1-37, 3rd Generation Partnership Project, Valbonne, France (Sep. 2017).

(56) References Cited

OTHER PUBLICATIONS

"LDPC design for eMBB data," 3GPP TSG RAN WG1 Meeting #88, Athens, Greece, R1-1701706, Total 7 pages, 3rd Generation Partnership Project, Valbonne, France (Feb. 13-17, 2017).
Safavi et al., "Ultra Low Density Spread Transmission," IEEE Communications Letters, vol. 20, No. 7, XP011616351, pp. 1373-1376, Institute of Electrical and Electronics Engineers, New York, New York (Jul. 2016).
Zaidi et al., "Ericsson Technology 5G New Radio: Designing for the Future the 5G NR Physical Layer," Ericsson Technology Review, XP055780903, total 14 pages (Jul. 2017).
EP/17765420.9, Office Action, dated Mar. 5, 2021.
Xie Qiuliang et al., "Bit-interleaved LDPC coded modulation with iterative demapping and decoding," Total 4 pages (2009) With English abstract.
Lei et al., "Demultiplexer Design for Multi-Edge Type LDPC Coded Modulation," ISIT 2009, Seoul, Korea, Total 5 pages (Jun. 28-Jul. 3, 2009).
"3rd Generation Partnership Project; Technical Specification Group Radio Access Network; NR; Multiplexing and channel coding (Release 16)," 3GPP TS 38.212 V16.5.0, total 152 pages, 3rd Generation Partnership Project, Valbonne, France (Mar. 2021).
"Digital Video Broadcasting (DVB); Second generation framing structure, channel coding and modulation systems for Broadcasting, Interactive Services, News Gathering and other broadband satellite applications," ETSI EN 302 307 V1.1.2, XP014034070, total 74 pages (Jun. 2006).

\* cited by examiner

TRANSMITTING DEVICE, RECEIVING DEVICE AND METHODS THEREOF USING AN INTERLEAVED CODEWORD

CROSS-REFERENCE TO RELATED APPLICATIONS

This application is a continuation of International Application No. PCT/EP2017/072643, filed on Sep. 8, 2017, the disclosure of which is hereby incorporated by reference in its entirety.

TECHNICAL FIELD

The disclosure relates to a transmitting device and a receiving device. Furthermore, the disclosure also relates to corresponding methods and a computer program.

BACKGROUND

Bit-interleaved low density parity check (LDPC) coded modulation represents one of the most commonly used transmission schemes for wireless communications capable of operating very close to the system capacity. Some international standards including IEEE and 3GPP, under new radio (NR), adopted LDPC codes with adaptive modulations of order up to 256QAM to achieve very high spectral efficiencies.

NR LDPC codes are quasi-cyclic (QC) LDPC codes of a length n and a dimension k<n. These codes are specified as the null space of a k×(n+2Z) binary systematic parity-check matrix (PCM) H where the first 2Z systematic codeword bits are punctured. The binary PCM H is generated in the following way:

Selected a base-graph matrix $H_{BG}$ according to the criteria specified in NR specification among two possible base matrices $H_{BG,1}$ and $H_{BG,2}$, depending on the codeword length n and dimension k;

Lift $H_{BG}$ by a lifting size Z, where Z is determined based on the codeword length n and dimension k, to obtain H.

Lifting consists in the following steps: the matrix H is obtained by replacing each element of $H_{BG}$ with a Z×Z matrix, according to the following:

Each element of value 0 in $H_{BG}$ is replaced by an all zero matrix 0 of size Z×Z;

Each element of value 1 in $H_{BG}$ is replaced by a circular permutation matrix $I(P_{i,j})$ of size Z×Z, where i and j are the row and column indices of the element, and $I(P_{i,j})$ is obtained by circularly shifting the identity matrix I of size Z×Z to the right $P_{i,j}$ times. The value of $P_{i,j}$ is given by $P_{i,j}=\text{mod}(V_{i,j},Z)$. The value of $V_{i,j}$ is given by the set index $i_{LS}$ and the selected base matrix.

The NR LDPC encoder maps the information vector $i=(i_1, \ldots, i_k)$ of size k to a vector $d=(d_1, \ldots, d_{n+2Z})$ as $$d=iG \quad (1)$$

where G is a binary matrix of size k×n called generator matrix. In case of systematic codes, the generator matrix has the following structure:

$$G=[I_k\ P] \quad (2)$$

where $I_k$ is a k×k identity matrix and P is a k×(n−k) matrix. When the generator matrix is in systematic form, as in (2), a parity check matrix can be easily obtained as $$H_S=[P^T\ I_{n-k}] \quad (3)$$

where $P^T$ denotes the transpose of P. It is worth noting that any matrix H that satisfies the following condition:

$$GH^T=0 \quad (4)$$

where 0 is an all-zero vector with (n−k) elements, can be used as a parity check matrix for the code generated by G. Therefore, any full-rank matrix obtained from linear combinations of the rows of $H_S$ is a parity-check matrix for the code generated by G. The parity-check matrices specified in NR are not in systematic form (3).

The NR LDPC codeword vector $c=(c_1, \ldots, c_n)$ is obtained by puncturing the first 2Z systematic bits from a vector d. Therefore, the codeword vector c has the following structure:

$c=(i_{2Z+1}, i_{2Z+2}, \ldots, i_k, w_{n-k+2Z})$, where $w=w(w_1, \ldots, w_{n-k+2Z})$ are parity-check bits obtained such that $$H \times \begin{bmatrix} i^T \\ w^T \end{bmatrix} = 0.$$

Thus, the NR LDPC code is not systematic. However, its codewords contain a large subset of the information bits that enter the LDPC encoder. LDPC codes are typically decoded using low-complexity iterative algorithms that perform belief-propagation (BP) on a bipartite graph whose adjacency matrix is the PCM of the LDPC code.

Modulation symbols are drawn from a constellation $\chi_l=\{s_1^{(l)}, \ldots, s_{M_l}^{(l)}\}$ belonging to a set of available constellations $\chi=\{\chi_1, \ldots, \chi_L\}$. Each constellation $\chi_l$, l=1, ..., L, is characterized by a size $M_l=|\chi_l|$ and an order $m_l=\log_2 M_l$. A labeling $L(\chi_l)$ associates to each constellation symbol of $\chi_l$ a distinct binary vector of $m_l$ bits. For ease of notation, the constellation index is hereinafter dropped and reused again when needed. Each bit in the binary label of constellation $\chi$ is characterized by a bit-level capacity, conventionally defined as the mutual information of each bit in the constellation's binary label, measured when constellation symbols are transmitted on a certain channel, e.g. the additive white Gaussian noise (AWGN) channel. In particular, in a conventional bit-interleaved coded modulation (BICM) scheme, at the transmitter each m-tuple $(e_1, \ldots, e_m)$ of coded bits is mapped to a constellation symbol s ∈ χ which is then transmitted. At the receiver, a detector computes log-likelihood ratios (LLRs) of the transmitted bits as $$\lambda_k = \log \frac{P(e_k=1|y)}{P(e_k=0|y)} = \log \frac{\sum_{s \in \chi:L_k(s)=1} P(s|y)}{\sum_{s \in \chi:L_k(s)=0} P(s|y)} \quad (5)$$

for k=1, ..., m, where P(ε) indicates the probability that event ε occurs, y is the received signal and $L_k(s)$ indicates the kth bit of the label associated to constellation symbol s. The bit-level capacity is defined as $$\beta_k=I(e_k;\lambda_k) \quad (6)$$

where I(a; b) indicates the mutual information of symbols a and b. If, for example, the channel is AWGN, the bit-level capacity can be estimated as $$\beta_k=m-\mathbb{E}_{s,y}[\log(1+e^{\lambda_k})-\mathcal{L}_k(s)\lambda_k] \quad (7)$$

where m is the constellation order and $\mathbb{E}_{s,y}[.]$ denotes the expectation operator.

For most channels of practical interest, including the AWGN channel, bit-level capacities are monotone non-decreasing functions $\beta_k, k=1, \ldots, m$ of the SNR $\rho$ experienced on the channel.

SUMMARY

An objective of implementation forms of the disclosure is to provide a solution which mitigates or solves the drawbacks and problems of conventional solutions.

The above and further objectives are solved by the subject matter of the independent claims.

Further advantageous embodiments of the present invention can be found in the dependent claims.

According to a first aspect of the disclosure, the above mentioned and other objectives are achieved with a transmitting device for a communication system, the transmitting device being configured to obtain an information message comprising information bits addressed for a receiving device; encode the information message so as to obtain a codeword; rate-match the codeword so as to produce a rate-matched codeword comprising systematic bits and parity-check bits; and jointly interleave the systematic bits and parity-check bits of the rate-matched codeword so as to obtain an interleaved codeword, wherein the systematic bits of the interleaved codeword are mapped to modulation label positions of a modulation constellation with first reliabilities and the parity-check bits of the interleaved codeword are mapped to modulation label positions of the modulation constellation with second reliabilities.

A transmitting device according to the first aspect provides a number of advantages over conventional solutions. An advantage of the transmitting device is to provide improved performance in respect of error rate compared to conventional solutions, i.e. lower error rate for any given signal-to-noise ratio (SNR) or equivalent quality measure. This is due to the fact that the coded transmissions are more reliable by using the transmitting device according to the first aspect. This is especially the case for low-density parity-check code (LDCP) coded transmissions with high order modulation.

In an implementation form of a transmitting device according to the first aspect, each first reliability is higher than any second reliability in an initial transmission.

The initial transmission is performed when a new information message is transmitted to the receiving device.

In an implementation form of a transmitting device according to the first aspect, each first reliability is lower than any second reliability in a re-transmission.

The re-transmission occurs when the initial transmission was unsuccessful and/or the receiving device indicates to the transmitting device that it did not successfully decode the information message. This may e.g. relate to re-transmission schemes, such as HARQ, etc. The re-transmission is performed after the initial transmission.

In an implementation form of a transmitting device according to the first aspect, the interleaved codeword is a matrix having m columns and s rows, wherein m is the number of bits in the labels of the modulation constellation, and wherein s times m is at least equal to the length of the codeword.

An advantage with this implementation form is that the matrix form is a simple interleave structure which easily can be implemented, e.g. in hardware or in digital signal processing software.

In an implementation form of a transmitting device according to the first aspect, the transmitting is further configured to, in an initial transmission, circularly shift each row of the matrix so as to obtain a re-arranged row for each row of the matrix, wherein all systematic bits of a row of the matrix are arranged in the left-most positions of a re-arranged row and all parity-check bits of the row of the matrix are arranged in the right-most positions of the re-arranged row, wherein bits in the left-most positions of the re-arranged row are mapped to modulation label positions of the modulation constellation with a first reliability and bits in the right-most positions of the re-arranged row are mapped to modulation label positions of the modulation constellation with a second reliability.

An advantage with this implementation form is that circular shift permutations are simple to implement as the interleaver output can be generated by simply sequentially reading the bits in their input, starting from a certain position, and wrapping around to first input bit when the last input bit is reached.

In an implementation form of a transmitting device according to the first aspect, the transmitting is further configured to, in a re-transmission, circularly shift each row of the matrix so as to obtain a re-arranged row for each row of the matrix, wherein systematic bits of a row of the matrix are arranged in the right-most positions of a re-arranged row and parity-check bits of the row of the matrix are arranged in the left-most positions of the re-arranged row, wherein bits in the left-most positions of the re-arranged row are mapped to modulation label positions of the modulation constellation with a second reliability and bits in the right-most positions of the re-arranged row are mapped to modulation label positions of the modulation constellation with a first reliability.

An advantage with this implementation form is that circular shift permutations are simple to implement as the interleaver output can be generated by simply sequentially reading the bits in their input, starting from a certain position, and wrapping around to first input bit when the last input bit is reached. Moreover, arranging parity-check bits in the most reliable modulation bit label positions helps the decoder to increase the coding gain, thereby resulting in a better error protection for the transmitted information message.

In an implementation form of a transmitting device according to the first aspect, the transmitting is further configured to map each re-arranged row onto a modulation symbol of the modulation constellation so as to obtain a plurality of modulation symbols; and transmit the plurality of modulation symbols in a communication signal to the receiving device.

An advantage with this implementation form is that each re-arranged row already has the same size as the modulation label. Therefore, it is simple (low complexity) to perform a one-to-one mapping of the re-arranged rows to modulation symbols.

In an implementation form of a transmitting device according to the first aspect, the transmitting is further configured to, in an initial transmission, select all systematic bits of each row of the matrix so as obtain a first sub-row for each row of the matrix, wherein a first sub-row comprises all systematic bits of a row of the matrix, wherein bits in the first sub-row are mapped to modulation label positions of the modulation constellation with a first reliability;

select all parity-check bits of each row of the matrix so as obtain a second sub-row for each row of the matrix, wherein a second sub-row comprises all parity-check bits of a row of the matrix, wherein bits in the second sub-row are mapped to modulation label positions of the modulation constellation with a second reliability.

This implementation form is capable of grouping the systematics bits in the most reliable modulation label positions and the parity-check bits in the less reliable modulation label positions even when the information bits (and thus also the parity-check bits) are arranged non-contiguously in a row.

In an implementation form of a transmitting device according to the first aspect, the transmitting is further configured to, in a re-transmission, select parity-check bits of each row of the matrix so as obtain a first sub-row for each row of the matrix, wherein a first sub-row comprises the parity-check bits of a row of the matrix, wherein bits in the first sub-row are mapped to modulation label positions of the modulation constellation with a second reliability; and select systematic bits of each row of the matrix so as obtain a second sub-row for each row of the matrix, wherein a second sub-row comprises the systematic bits of a row of the matrix, wherein bits in the second sub-row are mapped to modulation label positions of the modulation constellation with a first reliability.

This implementation form is capable of grouping the systematics bits in the most reliable modulation label positions and the parity-check bits in the less reliable modulation label positions even when the information bits (and thus also the parity-check bits) are arranged non-contiguously in a row.

In an implementation form of a transmitting device according to the first aspect, the transmitting is further configured to combine the first sub-row and the second sub-row of each row in the matrix so as to obtain a combined row for each row of the matrix; map each combined row to a modulation symbol of the modulation constellation so as to obtain a plurality of modulation symbols; and transmit the plurality of modulation symbols in a communication signal to the receiving device.

An advantage with this implementation form is that each combined row already has the same size as the modulation label, therefore it is simple (low complexity) to perform a one-to-one mapping of the combined rows to modulation symbols.

In an implementation form of a transmitting device according to the first aspect, the transmitting is further configured to determine a control message, wherein the control message comprises an indication of a number of information bits of the information message, a number of encoded bits of the codeword, and a modulation order of the modulation symbol; and transmit the control message to the receiving device.

An advantage with this implementation form is that the control message informs the receiving device about the interleaving operations thereby making easier for the receiving device to deinterleave.

In an implementation form of a transmitting device according to the first aspect, the modulation constellation is a quadrature amplitude modulation constellation.

An advantage with this implementation form is that quadrature amplitude modulations are simple to implement and very widely used modulations which exhibit multiple reliability levels, thereby potentially provide good performance when used with the transmitting device according to the first aspect.

In an implementation form of a transmitting device according to the first aspect, the codeword belongs to a low-density parity-check code book.

According to a second aspect of the disclosure, the above mentioned and other objectives are achieved with a receiving device for a wireless communication system, the receiving device being configured to receive a communication signal from a transmitting device, wherein the communication signal comprises a plurality of modulation symbols; de-map the plurality of modulation symbols so as to obtain a plurality of soft bit labels, wherein each soft bit label of the plurality of soft bit labels comprises systematic soft bits and parity-check soft bits; deinterleave the plurality of soft bit labels so as to obtain a deinterleaved soft codeword, wherein the systematic soft bits of the plurality of soft bit labels are de-mapped from modulation label positions of a modulation constellation with first reliabilities and the parity-check soft bits of the plurality of soft bit labels are de-mapped from modulation label positions of the modulation constellation with second reliabilities; and de-rate-match the deinterleaved soft codeword so as to obtain a de-rate-matched soft codeword.

A receiving device according to the second aspect provides a number of advantages over conventional solutions. An advantage of the receiving device is to provide improved performance in respect of error rate compared to conventional solutions, i.e. lower error rate for any given signal-to-noise ratio (SNR) or equivalent quality measure. This is due to the fact that the coded transmissions are more reliable by using the transmitting device according to the first aspect. This is especially the case for low-density parity-check code (LDCP) coded transmissions with high order modulation.

In an implementation form of a receiving device according to the second aspect, each first reliability is higher than any second reliability in an initial reception. Mentioned initial reception corresponds to the initial transmission of the transmitting device.

In an implementation form of a receiving device according to the second aspect, each first reliability is lower than any second reliability in a subsequent reception. Mentioned subsequent reception corresponds to the re-transmission of the transmitting device.

In an implementation form of a receiving device according to the second aspect, the receiving device is further configured to decode the de-rate matched soft codeword so as to obtain a codeword.

An advantage with this implementation form is that decoding corrects the errors in the de-rate-matched codeword thereby delivering at its output a more reliable message.

In an implementation form of a receiving device according to the second aspect, the receiving device is further configured to obtain a control message, wherein the control message comprises an indication of a number of information bits of the information message, a number of encoded bits of the codeword, and a modulation order of the modulation symbol; and deinterleave the plurality of soft labels based on the control message.

An advantage with this implementation form is that by obtaining the control message, the receiving device is informed about the interleaving operations performed by the transmitting device thereby making easier for the receiving device to deinterleave.

According to a third aspect of the disclosure, the above mentioned and other objectives are achieved with a method for a transmitting device, the method comprises obtaining an information message comprising information bits addressed for a receiving device; encoding the information message so as to obtain a codeword; rate-matching the codeword so as to produce a rate-matched codeword comprising systematic bits and parity-check bits; and jointly interleaving the systematic bits and parity-check bits of the rate-matched codeword so as to obtain an interleaved codeword, wherein the systematic bits of the interleaved codeword are mapped to modulation label positions of a modulation constellation with first reliabilities and the parity-check bits of the interleaved codeword are mapped to modulation label positions of the modulation constellation with second reliabilities.

The method according to the third aspect can be extended into implementation forms corresponding to the implementation forms of the transmitting device according to the first aspect. Hence, an implementation form of the method comprises the feature(s) of the corresponding implementation form of the transmitting device.

The advantages of the methods according to the third aspect are the same as those for the corresponding implementation forms of the transmitting device according to the first aspect.

According to a fourth aspect of the disclosure, the above mentioned and other objectives are achieved with a method for a receiving device, the method comprises receiving a communication signal from a transmitting device, wherein the communication signal comprises a plurality of modulation symbols; de-mapping the plurality of modulation symbols so as to obtain a plurality of soft bit labels, wherein each soft bit label of the plurality of soft bit labels comprises systematic soft bits and parity-check soft bits; deinterleaving the plurality of soft bit labels so as to obtain a deinterleaved soft codeword, wherein the systematic soft bits of the plurality of soft bit labels are de-mapped from modulation label positions of a modulation constellation with first reliabilities and the parity-check soft bits of the plurality of soft bit labels are de-mapped from modulation label positions of the modulation constellation with second reliabilities; and de-rate-matching the deinterleaved soft codeword so as to obtain a de-rate-matched soft codeword.

The method according to the fourth aspect can be extended into implementation forms corresponding to the implementation forms of the receiving device according to the second aspect. Hence, an implementation form of the method comprises the feature(s) of the corresponding implementation form of the receiving device.

The advantages of the methods according to the fourth aspect are the same as those for the corresponding implementation forms of the receiving device according to the second aspect.

The disclosure also relates to a computer program, characterized in code means, which when run by processing means causes said processing means to execute any method according to the embodiments of the present invention. Further, the disclosure also relates to a computer program product comprising a computer readable medium and said mentioned computer program, wherein said computer program is included in the computer readable medium, and the computer readable medium comprises one or more of the group: Read-Only Memory (ROM), Programmable ROM (PROM), Erasable PROM (EPROM), Flash memory, Electrically EPROM (EEPROM) and hard disk drive.

Further applications and advantages of the embodiments of present invention will be apparent from the following detailed description.

BRIEF DESCRIPTION OF THE DRAWINGS

The appended drawings are intended to clarify and explain different embodiments of the present invention, in which.

DETAILED DESCRIPTION

Figure 1:
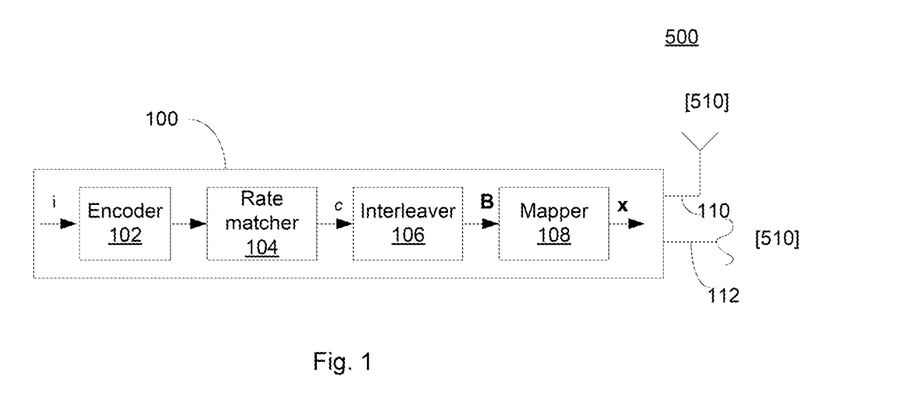
FIG. 1 shows a transmitting device according to an embodiment of the disclosure.
Figure 2:
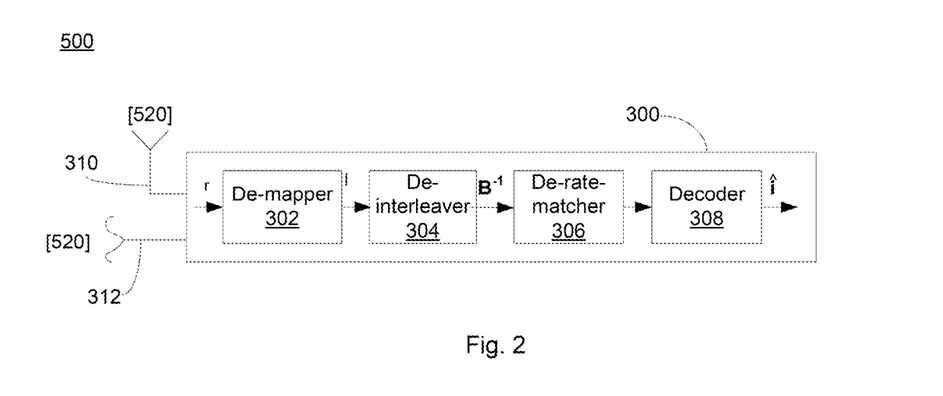
FIG. 2 shows a receiving device according to an embodiment of the disclosure.

FIG. 1 shows a block scheme of a transmitting device 100 according to an embodiment of the disclosure. A block scheme of a corresponding receiving device 300 according to an embodiment of the disclosure is shown in FIG. 2. For providing an understanding of the disclosure mentioned embodiments are described in a LDPC-coded transmission scheme using quadrature amplitude modulation (QAM) without being limited thereto. Other codes and modulation techniques can be used in conjunction with the disclosure. For example, any linear block codes, such as turbo codes, serially-concatenated convolutional codes, Reed-Solomon (R-S) codes, Bose-Chaudhuri-Hocquenghem (BCH) codes, and polar codes can be used in conjunction with the disclosure. As for modulation techniques, any modulation techniques, such as M-QAM, M-PSK, M-PPM, can be used in conjunction with the disclosure.

The transmitting device 100 according to the embodiment in FIG. 1 comprises an encoder 102 (in this example a LDPC encoder), a rate matcher 104, an interleaver 106, and a mapper 108 (in this example a QAM mapper) coupled to each other as illustrated in FIG. 1. The transmitting device 100 further comprises wireless 110 and/or wired 112 communication means since the present transmitting device 100 can operate in a wireless communication system, a wired communication system or in a combination thereof.

The encoder 102 is configured to obtain an information message comprising information bits addressed for a receiving device 300 (see FIG. 2). The encoder 102 is further configured to encode the information message so as to obtain a codeword and forward the codeword to the rate matcher 104. The LDPC encoder 102 receives an information message I comprising information bits and encodes the information message I so as to generate a codeword c. At the output of the LDPC encoder 102, the generated codeword vector c has length n bits. The first k−2Z components of the codeword vector c are systematic bits and the remaining components of the codeword vector c are parity-check bits in the non rate-matched case.

Upon reception of the codeword c the rate matcher 104 is configured to rate-match the codeword c so as to produce a rate-matched codeword comprising systematic bits and parity-check bits, the latter also known as redundancy bits. In an initial transmission, denoted by redundancy version rv=0, the rate matcher 104 punctures the last parity-check bits of the codeword c and none of the initial systematic bits in the codeword are punctured. In subsequent transmissions, the rate matcher 104 punctures the systematic bits and the parity-check bits, where the redundancy version rv indicates a combination of systematic and parity-check bits that are punctured.

The interleaver 106 receiving the rate-matched codeword is configured to jointly interleave the systematic bits and parity-check bits of the rate-matched codeword so as to obtain an interleaved codeword. The interleaved codeword is generally a matrix having m columns and s rows, wherein m is the number of bits in the labels of the modulation constellation, and wherein s times m is at least equal to the length of the codeword. It should however be noted that in the case no rate-matching is performed, the input to the interleaver 106 will be a non rate-matched codeword c. In this operation of the interleaver 106 the systematic bits of the interleaved codeword c are mapped to modulation label positions of a modulation constellation with first reliabilities and the parity-check bits of the interleaved codeword are mapped to modulation label positions of the modulation constellation with second reliabilities, such that each first reliability is higher than any second reliability in an initial transmission, and each first reliability is lower than any second reliability in a re-transmission. The codeword $c=(c_1, c_2, \ldots c_n)$ is then mapped to $s=\lceil n/m \rceil$ modulation symbols, where $M=2^m$ is the size of the modulator constellation. Mapping to modulation symbols is performed in the following way: the codeword c is first interleaved by writing it column-wise to a matrix B of size s×m (s rows, m columns), starting from the upper left corner and proceeding top-to-bottom first and then left-to-right. In this way, the (k−2Z) systematic bits in the codeword c will be written in the leftmost $\lceil (k-2Z)/s \rceil$ columns. If the codeword size n is not an integer multiple of m, then $N_z=(sm-n)$ zero-padding bits are inserted at the end of the last column of matrix B. In this way, the interleaver can handle codewords c of any integer size.

The content of matrix B is then read out row-wise, starting from the first row. The $r^{th}$ row $b_r=(b_{r,0}, \ldots, b_{r,m-1})$ is read as a m-tuple $b(i), \ldots, b(i+m-1)$ and mapped to a complex-valued QAM symbol $x=I+jQ$ in the mapper 108. According to the modulation mapping therein specified, in the m-tuple $b(i), \ldots, b(i+m-1)$ bits are arranged in non-increasing order of bit-level capacity, i.e., $b(i)$, $b(i+1)$ have the highest bit-level capacity, $b(i+2)$, $b(i+3)$ have the second highest bit-level capacity, $\ldots$, $b(i+m-2)$, $b(i+m-1)$ have the lowest bit-level capacity. After QAM mapping, the complex modulation symbols x are collected into a signal vector x and transmitted to the receiving device 300 in a communication system 500.

The proposed interleaver operations permute the bit positions in a codeword so that the resulting permuted codeword contains a sequence of segments of coded bits, with each segment intended to be mapped to a separate modulation symbol. Each segment contains parity check bits and systematic bits arranged in a desired order. The interleaver herein therefore jointly interleaves/permutes the systematic bits and the parity-check bits. Each first reliability is higher than any second reliability in an initial transmission, and the initial transmission is performed when a new information message is transmitted to the receiving device. Each first reliability is lower than any second reliability in a re-transmission, and the re-transmission occurs when the initial transmission was unsuccessful and/or the receiving device indicates to the transmitting device that it did not successfully decode the information message. This may e.g. relate to re-transmission schemes, such as HARQ, etc. The re-transmission is performed after the initial transmission.

Furthermore, as previously described there are cases with rv=0 (i.e. the initial transmission) in which none of the initial systematic bits in the codeword c are punctured and cases with rv>0 in which systematic bits are punctured.

Arranging systematic bits in the most reliable modulation bit label positions provides a higher robustness against transmission errors in the initial transmission, as the systematic bits are delivered to the receiver with higher reliability, thereby obtaining a better error protection for the transmitted information message.

For re-transmission, arranging parity-check bits in the most reliable modulation bit label positions helps the decoder to increase the coding gain, thereby resulting in a better error protection for the transmitted information message when decoding is performed after a re-transmission.

Figure 3:
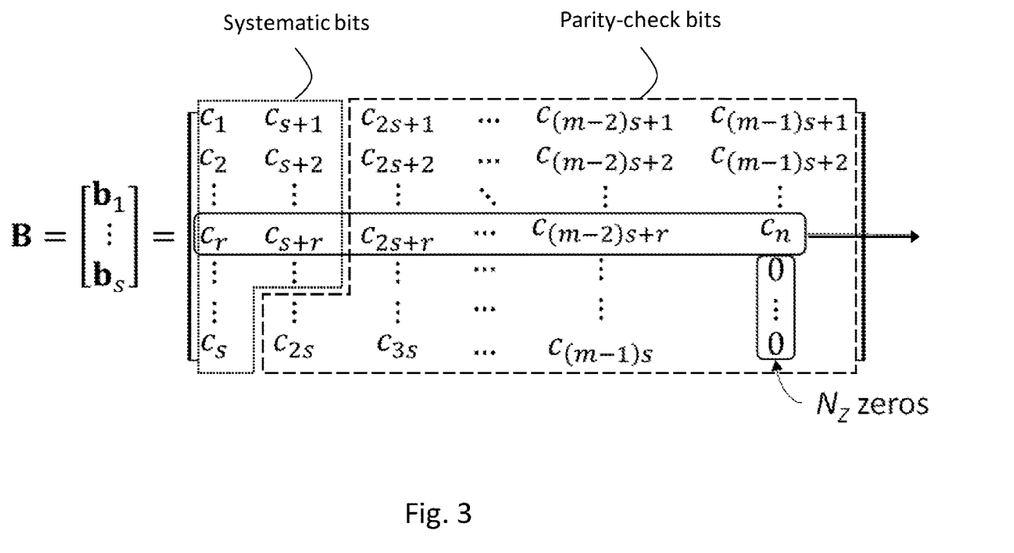
FIG. 3 shows an interleaver structure according to an embodiment of the present invention.

In the initial transmission case, i.e., rv=0, the content of matrix B can be written as in FIG. 3, where the information bits are in the left-most positions and the parity-check bits are in the right-most positions. This structure can be interpreted as a maximum-distance interleaver 106 with a particular ordering of the systematic bits and the parity-check bits of the codeword c. The interleaver 106 jointly permutes the systematic bits and the parity-check bits and, at the same time, produces an ordering in which the systematic bits of the interleaved codeword c are mapped to modulation label positions of a modulation constellation with first reliabilities and the parity-check bits of the interleaved codeword c are mapped to modulation label positions of the modulation constellation with second reliabilities, wherein each first reliability is higher than any second reliability.

The cases of re-transmissions are now considered, i.e., when the redundancy version is ≥1. In this case, the codeword c is provided by the encoder 102 and the rate-matcher 104 to the interleaver 106. The rate-matcher 104 writes the LDPC encoder output into a circular buffer and then starts reading the bits in the circular buffer from a certain position. The initial position reading position in the circular buffer may correspond to systematic bit or a parity-check bit. Thus, the codeword c entering the interleaver 106 may have one of the structures shown in FIG. 4. For all cases except case (a) in FIG. 4, which corresponds to the non rate-matched case, the systematic bits would not be placed in the leftmost columns of matrix B. Therefore, those systematic bits would not be mapped to most reliable modulation bits by the interleaver 106. However, having parity-check bits mapped to most reliable positions may be beneficial in a re-transmission following an initial transmission where systematic bits are mapped to most reliable modulation bits. This behavior has been observed in simulations and can be explained by the higher coding gain brought by highly reliable parity-check bits.

Figure 5:
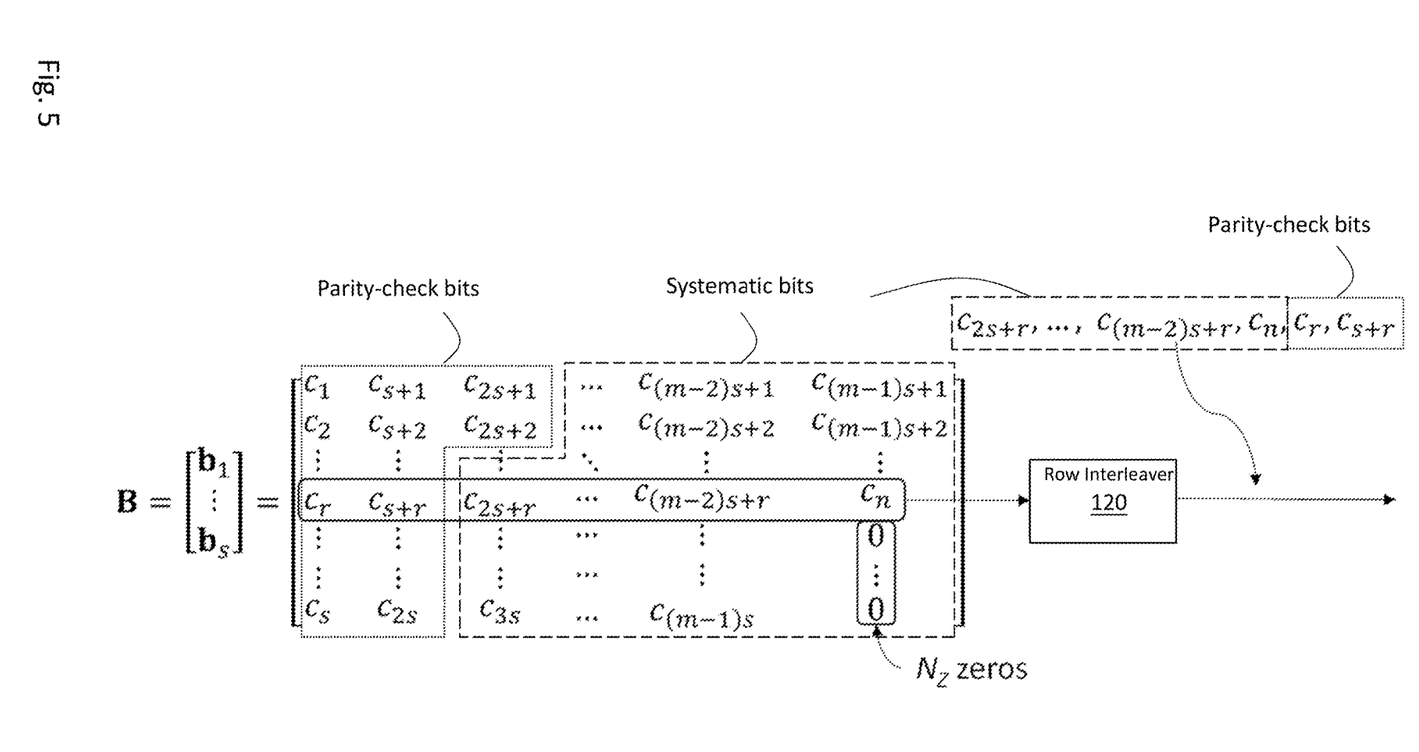
FIG. 5 shows an interleaver structure according to an embodiment of the disclosure.

In order to obtain the desired mapping of the systematic bits and the parity-check bits, it is disclosed an interleaver structure and mapping to modulation symbols as shown FIG. 5. In order to obtain the desired mapping, the bits in each row of the matrix B are permuted using a row interleaver 120 prior to modulation mapping. The row interleaver 120 permutes the m bits in each row of matrix B in a way that, after interleaving, the systematic bits are mapped to the most reliable or least reliable bits in the modulation label depending on if the transmission is an initial transmission or a re-transmission. In the following disclosure two main solutions for structuring the rows of the matrix using the row interleaver 120 are described. In one solution circular shift is applied on each row of the matrix B, and in another solution two sub-rows are formed for each row the matrix B, wherein one sub-row comprises all systematic bits of a row and another one sub-row comprises all parity-check bits of the row.

According to an embodiment, the row interleaver 120 performs a left circular shift of each row of the matrix in the initial transmission. In the example shown in FIG. 5, each row is left-circularly shifted until all systematic bits in that row occupy the first (left-most) positions and all parity-check bits occupy the last (right-most) positions. After row interleaving, each row is mapped to a modulation symbol. Hence, the row interleaver 120 herein is configured to circularly shift each row of the matrix so as to obtain a re-arranged row for each row of the matrix in which all systematic bits of a row of the matrix are arranged in the left-most positions of a re-arranged row and all parity-check bits of the row of the matrix are arranged in the right-most positions of the re-arranged row. The bits in the left-most positions of the re-arranged row are mapped to modulation label positions of the modulation constellation with the first reliability and bits in the right-most positions of the re-arranged row are mapped to modulation label positions of the modulation constellation with the second reliability.

According to another embodiment, the row interleaver 120 performs a left circular shift of each row of the matrix in the re-transmission. In an example, each row is left-circularly shifted until all parity-check bits in that row occupy the first (left-most) positions and all systematic bits occupy the last (right-most) positions. After row interleaving, each row is mapped to a modulation symbol. Hence, the row interleaver 120 herein is configured to circularly shift each row of the matrix so as to obtain a re-arranged row for each row of the matrix in which all parity-check bits of a row of the matrix are arranged in the left-most positions of a re-arranged row and all systematic bits of the row of the matrix are arranged in the right-most positions of the re-arranged row. The bits in the left-most positions of the re-arranged row are mapped to modulation label positions of the modulation constellation with the second reliability and bits in the right-most positions of the re-arranged row are mapped to modulation label positions of the modulation constellation with the first reliability.

At transmission each re-arranged row is mapped onto a modulation symbol of the modulation constellation so as to obtain a plurality of modulation symbols. The plurality of modulation symbols are transmitted in a communication signal 510, in vector form denoted x, to the receiving device 300.

According to another embodiment, the row interleaver 120 herein is configured to select all systematic bits of each row of the matrix B so as obtain a first sub-row for each row of the matrix B in the initial transmission. The first sub-row comprises all systematic bits of a row of the matrix B, and the bits in the first sub-row are mapped to modulation label positions of the modulation constellation with the first reliability. Hence, in this first step the row interleaver 120 reads all the systematic bits in its input vector sequentially from left to right, skipping the parity-check bits, and sends those bits to its output. The row interleaver 120 is further configured to select all parity-check bits of each row of the matrix B so as obtain a second sub-row for each row of the matrix B. The second sub-row comprises all parity-check bits of a row of the matrix B, and the bits in the second sub-row are mapped to modulation label positions of the modulation constellation with the second reliability. Hence, in this second step, the row interleaver 120 sequentially reads all the parity-check bits in its input vector from left to right, skipping the systematic bits, and sends the read bits to its output.

According to another embodiment, the row interleaver 120 herein is configured to select all parity-check bits of each row of the matrix B so as obtain a first sub-row for each row of the matrix B in the re-transmission. The first sub-row comprises all parity-check bits of a row of the matrix B, and the bits in the first sub-row are mapped to modulation label positions of the modulation constellation with the second reliability. Hence, in this first step the row interleaver 120 reads all the parity-check bits in its input vector sequentially from left to right, skipping the systematic bits, and sends those bits to its output. The row interleaver 120 is further configured to select all systematic bits of each row of the matrix B so as obtain a second sub-row for each row of the matrix B. The second sub-row comprises all systematic bits of a row of the matrix B, and the bits in the second sub-row are mapped to modulation label positions of the modulation constellation with the first reliability. Hence, in this second step, the row interleaver 120 sequentially reads all the systematic bits in its input vector from left to right, skipping the parity-check bits, and sends the read bits to its output.

At transmission, the first sub-row and the second sub-row of each row in the matrix B are combined so as to obtain a combined row for each row of the matrix B. Each combined row is mapped to a modulation symbol of the modulation constellation so as to obtain a plurality of modulation symbols. The plurality of modulation symbols are transmitted in a communication signal x to the receiving device 300.

Figure 4:
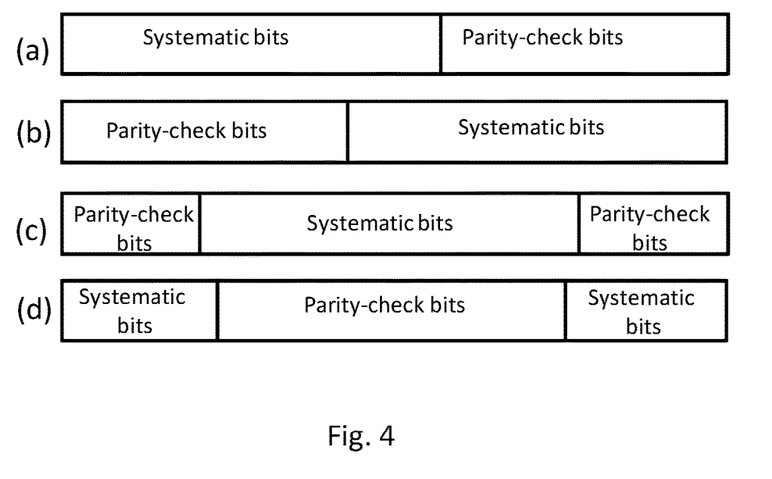
FIG. 4 shows different structures of LDPC codewords according to an embodiment of the disclosure.

By using the row interleaver 120 described in above embodiments, cases (c) and (d) in FIG. 4 are handled in the same way as case (b). It is further beneficial to consider that any row interleaver 120 does not change positions of the $N_z$ zeros in the lower-right part of the matrix B, as those zeros are already occupying low-reliability positions and therefore moving them to other higher-reliability positions would result in a waste of communication resources.

FIG. 2 shows a receiving device 300 according to an embodiment of the disclosure. The receiving device 300 in FIG. 2 comprises a de-mapper 302 (in this example a soft de-mapper), a de-interleaver 304, a de-rate-matcher 306, and a decoder 308 (in this example a LDCP decoder) coupled to each other as illustrated in FIG. 2. The receiving device 300 further comprises wireless 310 and/or wired 312 communication means since the present receiving device 300 can operate in wireless communication systems, wired communication systems or in a combination thereof. Generally, the receiving device 300 is configured to perform the inverse operations as the ones performed by the transmitting device 100 according to the disclosure.

A communication signal 520, in vector form denoted r, comprising a plurality of modulation symbols is received by the receiving device 300 and forwarded to the de-mapper 302. The received communication signal 520 is the transmitted communication signal 510 after having propagated through one or more channels, such as a radio channel or a wired communication channel.

The de-mapper 302 is configured to de-map the plurality of modulation symbols so as to obtain a plurality of soft bit labels. Each soft bit label of the plurality of soft bit labels comprises systematic soft bits and parity-check soft bits.

The deinterleaver 304 is configured to deinterleave the plurality of soft bit labels so as to obtain a deinterleaved soft codeword which spans the plurality of modulation symbols. The systematic soft bits of the plurality of soft bit labels are de-mapped from modulation label positions of a modulation constellation with first reliabilities and the parity-check soft bits of the plurality of soft bit labels are de-mapped from modulation label positions of the modulation constellation with second reliabilities, and each first reliability is higher than any second reliability in the initial reception, i.e. reception corresponding to an initial transmission, and each first reliability is lower than any second reliability in the subsequent reception, i.e. subsequent reception corresponding to a re-transmission. De-interleaving consists of performing the inverse operation as the one performed by the interleaver 106 in the transmitting device 100 so the deinterleaver 304 obtains as its input the vector I=($l_1$, . . . , $l_n$) of soft demodulated symbols and writes the vector I row-wise into a matrix $B^{-1}$ of the same size as B, i.e., s×m (s rows, m columns) starting from the upper left corner and proceeding left to right first and then top to bottom. The content of $B^{-1}$ is read out column-wise from top to bottom first and then left to right to the de-rate-matcher 306.

The de-rate-matcher 306 is configured to de-rate-match the deinterleaved soft codeword received from the deinterleaver 304 so as to obtain a de-rate-matched soft codeword.

Finally, the de-rate-matched soft codeword is sent to the LDPC decoder 308 for decoding so as to output an information message.

In further embodiments of the disclosure a control signaling mechanism from the transmitting device 100 to the receiving device 300 is provided. Therefore, the transmitting device 100 is configured to determine a control message. The control message comprises an indication of a number of information bits of the information message, a number of encoded bits of the codeword, and a modulation order of the modulation symbol. The transmitting device 100 transmits the control message to the receiving device 300 (not shown in the Figs.).

Correspondingly, the receiving device 300 is configured to obtain a control message. The control message comprises an indication of a number of information bits of the information message, a number of encoded bits of the codeword, and a modulation order of the modulation symbol. The receiving device 300 uses the information in the control message for deinterleaving the plurality of soft labels. Therefore, the receiving device 300 will be informed about the number of information bits, number of coded bits in the transmitted codeword and modulation order. The only additional information that the receiving device 300 further needs in order to determine the interleaver structure is knowledge of the redundancy version rv. This information about the redundancy version rv can be obtained, for example, from a local scheduler that computes transmission parameters for each transmission based on channel quality information, or from a remote device through a control channel, etc.

The receiving device 300 can receive the control message from a scheduler, a control node of the communication system, or directly from the transmitting device 100.

Figure 6:
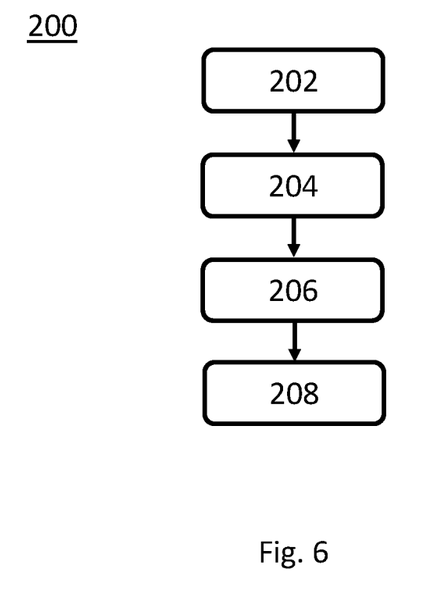
FIG. 6 shows a method for a transmitting device according to an embodiment of the disclosure.

FIG. 6 shows a flow chart of a method according to an embodiment of the disclosure. The method can be implemented in a transmitting device 100, such as the one in FIG. 1. The method 200 comprises obtaining 202 an information message comprising information bits addressed for a receiving device 300. The method 200 further comprises encoding 204 the information message so as to obtain a codeword. The method 200 further comprises rate-matching 206 the codeword so as to produce a rate-matched codeword comprising systematic bits and parity-check bits. The method 200 further comprises jointly interleaving 208 the systematic bits and parity-check bits of the rate-matched codeword so as to obtain an interleaved codeword, wherein the systematic bits of the interleaved codeword are mapped to modulation label positions of a modulation constellation with first reliabilities and the parity-check bits of the interleaved codeword are mapped to modulation label positions of the modulation constellation with second reliabilities.

Figure 7:
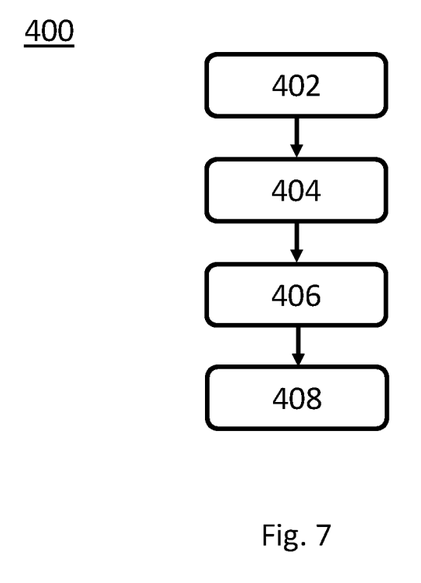
FIG. 7 shows a method for a receiving device according to an embodiment of the disclosure.

FIG. 7 shows a flow chart of a corresponding method according to an embodiment of the disclosure. The method can be implemented in a receiving device 100, such as the one in FIG. 2. The method 400 comprises receiving 402 a communication signal 520 from a transmitting device 100, wherein the communication signal 520 comprises a plurality of modulation symbols. The method 400 further comprises de-mapping 404 the plurality of modulation symbols so as to obtain a plurality of soft bit labels, wherein each soft bit label of the plurality of soft bit labels comprises systematic soft bits and parity-check soft bits. The method 400 further comprises deinterleaving 406 the plurality of soft bit labels so as to obtain a deinterleaved soft codeword, wherein the systematic soft bits of the plurality of soft bit labels are de-mapped from modulation label positions of a modulation constellation with first reliabilities and the parity-check soft bits of the plurality of soft bit labels are de-mapped from modulation label positions of the modulation constellation with second reliabilities. The method 400 further comprises de-rate-matching 408 the deinterleaved soft codeword so as to obtain a de-rate-matched soft codeword.

Figure 8:
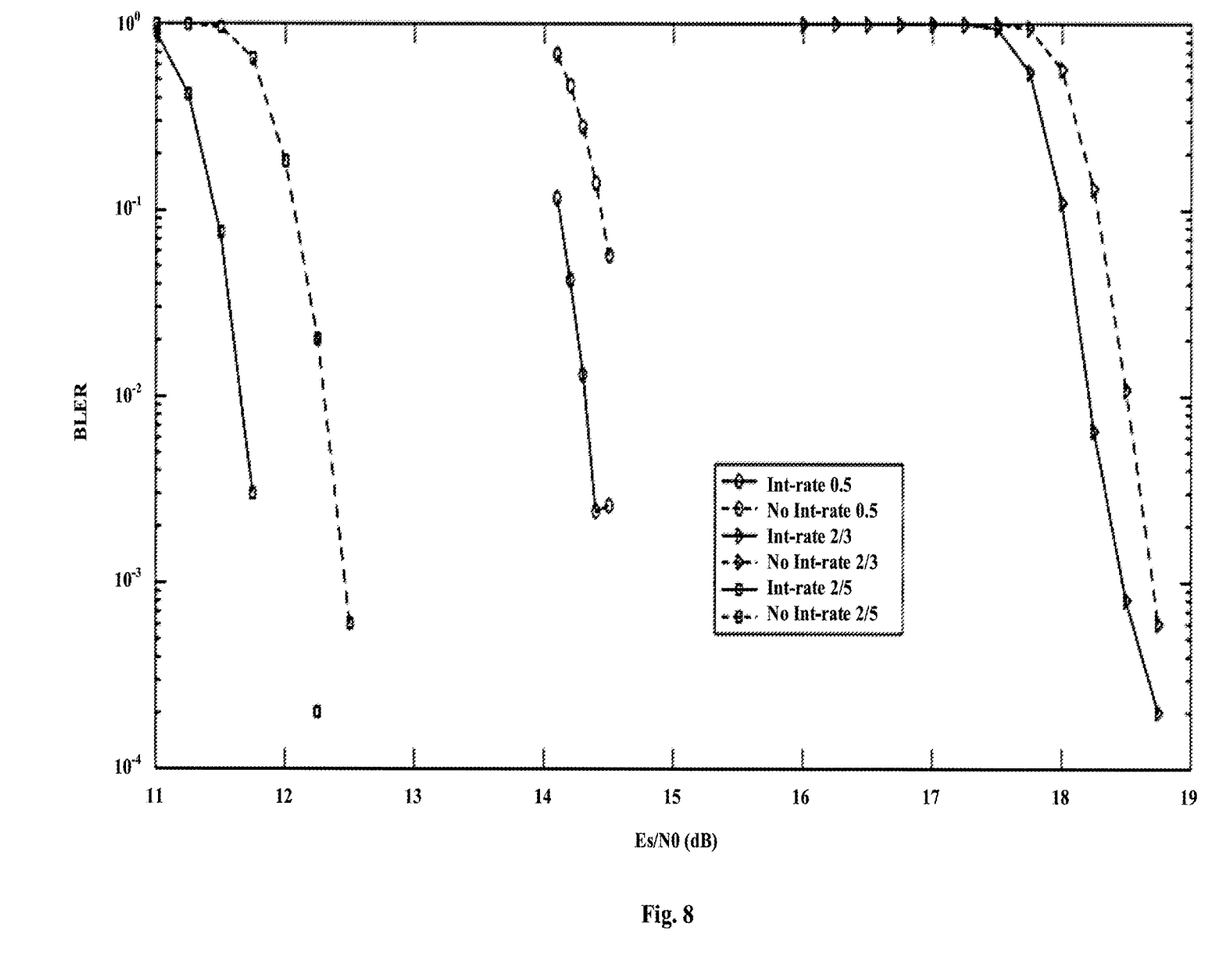
FIG. 8 shows performance of bit-interleaved LDPC according to embodiments of the disclosure compared with non bit-interleaved LDPC.

In this section some performance results for embodiments of the disclosure are presented with reference to FIG. 8. In this respect simulations have been performed and the simulation parameters are summarized in Table 1. The parity-check matrices were constructed using base matrix 1 as agreed in RAN1.

TABLE 1

Simulation parameters.

| | |
|---|---|
| Channel model | AWGN |
| Modulation | 256QAM |
| Codeword length | 12320, 9856, 7392 |
| Information word length | 4928 |
| Code rate | 0.4, 0.5, 0.667 |
| Decoding iterations | 50, flooding BP |

The x-axis shows signal-to-noise ratio (SNR) and the y-axis shows the block error rate (BLER). FIG. 8 shows the BLER performance of an LDPC-coded system using embodiments of the disclosure (solid lines) compared with a LDPC-coded system without interleaving (dashed lines). In these evaluations, it is assumed the initial transmission case, i.e. rv=0. We observe that significant gains can be obtained using the present interleaver. It can be derived from FIG. 8 that a gain of 0.25, 0.3, 0.625 dB corresponding to code rates 0.667, 0.5 and 0.4 is seen for BLER=0.1.

TABLE 2

SNR gain for block length K = 4928 bits and 256QAM modulation.

| Code rate | SNR gain @ BLER = $10^{-1}$ |
|---|---|
| 2/5 | 0.625 |
| 1/2 | 0.3 |
| 2/3 | 0.25 |

The transmitting device 100 and the receiving device 300 may be any type of communication device with the capabilities to transmit, respectively, receive communication signals in a communication system 500. Mentioned communication system 500 may be a wireless communication system, a wired communication system or in a combination thereof. Examples of such communication systems are LTE, LTE Advanced, NR, Wi-Fi, HSPA, HSDPA and Wideband CDMA.

In embodiments the transmitting device 100 and the receiving device 300 are a client device or a network access node.

The client device may be denoted herein as a user device, a User Equipment (UE), a mobile station, an internet of things (IoT) device, a sensor device, a wireless terminal and/or a mobile terminal, is enabled to communicate wirelessly in a wireless communication system, sometimes also referred to as a cellular radio system. The UEs may further be referred to as mobile telephones, cellular telephones, computer tablets or laptops with wireless capability. The UEs in the present context may be, for example, portable, pocket-storable, hand-held, computer-comprised, or vehicle-mounted mobile devices, enabled to communicate voice and/or data, via the radio access network, with another entity, such as another receiver or a server. The UE can be a Station (STA), which is any device that contains an IEEE 802.11-conformant Media Access Control (MAC) and Physical Layer (PHY) interface to the Wireless Medium (WM). The UE may also be configured for communication in 3GPP related LTE and LTE-Advanced, in WiMAX and its evolution, and in fifth generation wireless technologies, such as New Radio.

The network access node herein may also be denoted as a radio network access node, an access network access node, an access point, or a base station, e.g. a Radio Base Station (RBS), which in some networks may be referred to as transmitter, "eNB", "eNodeB", "NodeB" or "B node", depending on the technology and terminology used. The radio network access nodes may be of different classes such as e.g. macro eNodeB, home eNodeB or pico base station, based on transmission power and thereby also cell size. The radio network access node can be a Station (STA), which is any device that contains an IEEE 802.11-conformant Media Access Control (MAC) and Physical Layer (PHY) interface to the Wireless Medium (WM). The radio network access node may also be a base station corresponding to the fifth generation (5G) wireless systems.

Furthermore, any method according to embodiments of the disclosure may be implemented in a computer program, having code means, which when run by processing means causes the processing means to execute the steps of the method. The computer program is included in a computer readable medium of a computer program product. The computer readable medium may comprise essentially any memory, such as a Read-Only Memory (ROM), a Programmable Read-Only Memory (PROM), an Erasable PROM (EPROM), a Flash memory, an Electrically Erasable PROM (EEPROM), or a hard disk drive.

Moreover, it is realized by the skilled person that embodiments of the transmitting device 100 and the receiving device 300 comprise the necessary communication capabilities in the form of e.g., functions, means, units, elements, etc., for performing the present solution. Examples of other such means, units, elements and functions are: processors, memory, buffers, control logic, encoders, decoders, rate matchers, de-rate matchers, mapping units, multipliers, decision units, selecting units, switches, interleavers, de-interleavers, modulators, demodulators, inputs, outputs, antennas, amplifiers, receiver units, transmitter units, DSPs, MSDs, TCM encoder, TCM decoder, power supply units, power feeders, communication interfaces, communication protocols, etc. which are suitably arranged together for performing the present solution.

Especially, the processor(s) of the transmitting device 100 and the receiving device 300 may comprise, e.g., one or more instances of a Central Processing Unit (CPU), a processing unit, a processing circuit, a processor, an Application Specific Integrated Circuit (ASIC), a microprocessor, or other processing logic that may interpret and execute instructions. The expression "processor" may thus represent a processing circuitry comprising a plurality of processing circuits, such as, e.g., any, some or all of the ones mentioned above. The processing circuitry may further perform data processing functions for inputting, outputting, and processing of data comprising data buffering and device control functions, such as call processing control, user interface control, or the like.

Finally, it should be understood that the disclosure is not limited to the embodiments described above, but also relates to and incorporates all implementations within the scope of the appended independent claims.

What is claimed is:

1. A transmitting device for a communication system, the transmitting device comprising:
   a processor; and
   a non-transitory computer-readable medium including computer-executable instructions that, when executed by the processor, facilitate the transmitting device carrying out a method comprising:
      obtaining an information message comprising information bits addressed for a receiving device;
      encoding the information message to obtain a codeword;
      rate-matching the codeword to produce a rate-matched codeword comprising systematic bits and parity-check bits; and
      jointly interleaving the systematic bits and the parity-check bits of the rate-matched codeword to obtain an interleaved codeword, wherein the systematic bits of the interleaved codeword are mapped to modulation label positions of a modulation constellation with first reliabilities and the parity-check bits of the interleaved codeword are mapped to the modulation label positions of the modulation constellation with second reliabilities.

2. The transmitting device according to claim 1, wherein each of the first reliabilities is higher than any of the second reliabilities in an initial transmission.

3. The transmitting device according to claim 1, wherein each of the first reliabilities is lower than any of the second reliabilities in a re-transmission.

4. The transmitting device according to claim 2, wherein the interleaved codeword is a matrix having m columns and s rows, wherein m is the number of bits in labels of the modulation constellation, and wherein s times m is at least equal to a length of the codeword.

5. The transmitting device according to claim 4, wherein, in an initial transmission, the method comprises:
   circularly shifting each row of the matrix to obtain a re-arranged row for each row of the matrix, wherein systematic bits of a row of the matrix are arranged in left-most positions of a re-arranged row and parity-check bits of the row of the matrix are arranged in right-most positions of the re-arranged row, wherein bits in the left-most positions of the re-arranged row are mapped to the modulation label positions of the modulation constellation with a first reliability and bits in the right-most positions of the re-arranged row are mapped to the modulation label positions of the modulation constellation with a second reliability.

6. The transmitting device according to claim 2, wherein, in a re-transmission, the method comprises:
circularly shifting each row of the matrix to obtain a re-arranged row for each row of the matrix, wherein systematic bits of a row of the matrix are arranged in right-most positions of a re-arranged row and parity-check bits of the row of the matrix are arranged in left-most positions of the re-arranged row, wherein bits in the left-most positions of the re-arranged row are mapped to the modulation label positions of the modulation constellation with a second reliability and bits in the right-most positions of the re-arranged row are mapped to the modulation label positions of the modulation constellation with a first reliability.

7. The transmitting device according to claim 5, wherein the method further comprises:
mapping each re-arranged row onto a modulation symbol of the modulation constellation to obtain a plurality of modulation symbols; and
transmitting the plurality of modulation symbols in a communication signal to the receiving device.

8. The transmitting device according to claim 4, wherein, in the initial transmission, the method comprises:
selecting systematic bits of each row of the matrix to obtain a first sub-row for each row of the matrix, wherein a first sub-row comprises the systematic bits of a row of the matrix, wherein bits in the first sub-row are mapped to modulation label positions of the modulation constellation with a first reliability; and
selecting parity-check bits of each row of the matrix to obtain a second sub-row for each row of the matrix, wherein a second sub-row comprises the parity-check bits of a row of the matrix, wherein bits in the second sub-row are mapped to modulation label positions of the modulation constellation with a second reliability.

9. The transmitting device according to claim 4, wherein, in the re-transmission, the method comprises:
selecting parity-check bits of each row of the matrix to obtain a first sub-row for each row of the matrix, wherein a first sub-row comprises the parity-check bits of a row of the matrix, wherein bits in the first sub-row are mapped to modulation label positions of the modulation constellation with a second reliability; and
selecting systematic bits of each row of the matrix to obtain a second sub-row for each row of the matrix, wherein a second sub-row comprises the systematic bits of a row of the matrix, wherein bits in the second sub-row are mapped to modulation label positions of the modulation constellation with a first reliability.

10. The transmitting device according to claim 8, wherein the method comprises:
combining the first sub-row and the second sub-row of each row in the matrix to obtain a combined row for each row of the matrix;
mapping each combined row to a modulation symbol of the modulation constellation to obtain a plurality of modulation symbols; and
transmitting the plurality of modulation symbols in a communication signal to the receiving device.

11. The transmitting device according to claim 7, wherein the method comprises:
determining a control message, wherein the control message comprises an indication of a number of information bits of the information message, a number of encoded bits of the codeword, and a modulation order of the modulation symbol; and
transmitting the control message to the receiving device.

12. The transmitting device according to claim 1, wherein the modulation constellation is a quadrature amplitude modulation (QAM) constellation.

13. The transmitting device according to claim 1, wherein the codeword belongs to a low-density parity-check (LDPC) code book.

14. A receiving device for a communication system, the receiving device comprising:
a processor; and
a non-transitory computer-readable medium including computer-executable instructions that, when executed by the processor, facilitate the receiving device carrying out a method comprising:
receiving a communication signal from a transmitting device, wherein the communication signal comprises a plurality of modulation symbols;
de-mapping the plurality of modulation symbols to obtain a plurality of soft bit labels, wherein each soft bit label of the plurality of soft bit labels comprises systematic soft bits and parity-check soft bits;
deinterleaving the plurality of soft bit labels to obtain a deinterleaved soft codeword, wherein the systematic soft bits of the plurality of soft bit labels are de-mapped from modulation label positions of a modulation constellation with first reliabilities and the parity-check soft bits of the plurality of soft bit labels are de-mapped from the modulation label positions of the modulation constellation with second reliabilities; and
de-rate-matching the deinterleaved soft codeword to obtain a de-rate-matched soft codeword.

15. The receiving device according to claim 14, wherein each of the first reliabilities is higher than any of the second reliabilities in an initial reception.

16. The receiving device according to claim 14, wherein each of the first reliabilities is lower than any of the second reliabilities in a subsequent reception.

17. The receiving device according to claim 14, wherein the method further comprises:
decoding the de-rate matched soft codeword to obtain an information message.

18. The receiving device according to claim 14, wherein the method further comprises:
obtaining a control message, wherein the control message comprises an indication of a number of information bits of the information message, a number of encoded bits of the codeword, and a modulation order of the modulation symbol; and
deinterleaving the plurality of soft labels based on the control message.

19. A method for a transmitting device, the method comprising:
obtaining an information message comprising information bits addressed for a receiving device;
encoding the information message to obtain a codeword;
rate-matching the codeword to produce a rate-matched codeword comprising systematic bits and parity-check bits; and
jointly interleaving the systematic bits and the parity-check bits of the rate-matched codeword to obtain an interleaved codeword, wherein the systematic bits of the interleaved codeword are mapped to modulation label positions of a modulation constellation with first reliabilities and the parity-check bits of the interleaved codeword are mapped to the modulation label positions of the modulation constellation with second reliabilities.

20. A method for a receiving device, the method comprising:

receiving a communication signal from a transmitting device, wherein the communication signal comprises a plurality of modulation symbols;

de-mapping the plurality of modulation symbols to obtain a plurality of soft bit labels, wherein each soft bit label of the plurality of soft bit labels comprises systematic soft bits and parity-check soft bits;

deinterleaving the plurality of soft bit labels to obtain a deinterleaved soft codeword, wherein the systematic soft bits of the plurality of soft bit labels are de-mapped from modulation label positions of a modulation constellation with first reliabilities and the parity-check soft bits of the plurality of soft bit labels are de-mapped from the modulation label positions of the modulation constellation with second reliabilities; and de-rate-matching the deinterleaved soft codeword to obtain a de-rate-matched soft codeword.

21. A non-transitory computer-readable medium including a program code for performing, by a transmitting device, a method comprising:

obtaining an information message comprising information bits addressed for a receiving device;

encoding the information message to obtain a codeword;

rate-matching the codeword to produce a rate-matched codeword comprising systematic bits and parity-check bits; and jointly interleaving the systematic bits and the parity-check bits of the rate-matched codeword to obtain an interleaved codeword, wherein the systematic bits of the interleaved codeword are mapped to modulation label positions of a modulation constellation with first reliabilities and the parity-check bits of the interleaved codeword are mapped to the modulation label positions of the modulation constellation with second reliabilities when the program code runs on a computer.

22. A non-transitory computer-readable medium including a program code for performing, by a receiving device, a method comprising:

receiving a communication signal from a transmitting device, wherein the communication signal comprises a plurality of modulation symbols;

de-mapping the plurality of modulation symbols to obtain a plurality of soft bit labels, wherein each soft bit label of the plurality of soft bit labels comprises systematic soft bits and parity-check soft bits;

deinterleaving the plurality of soft bit labels to obtain a deinterleaved soft codeword, wherein the systematic soft bits of the plurality of soft bit labels are de-mapped from modulation label positions of a modulation constellation with first reliabilities and the parity-check soft bits of the plurality of soft bit labels are de-mapped from the modulation label positions of the modulation constellation with second reliabilities; and de-rate-matching the deinterleaved soft codeword to obtain a de-rate-matched soft codeword.

23. The transmitting device according to claim 4, wherein the method further comprises obtaining an interleaver output sequence $b=(b_1, \ldots, b_n)$ by reading out row-wise a content of a matrix B starting from a first row, so as to obtain $$b_{(r-1)m+j} = c_{(j-1)s+r}; r=1,\ldots,s; j=1,\ldots,m$$

where $c=(c_1, \ldots, c_n)$ is the codeword.

* * * * *